(12) United States Patent
Hu et al.

(10) Patent No.: US 6,559,033 B1
(45) Date of Patent: May 6, 2003

(54) PROCESSING FOR FORMING INTEGRATED CIRCUIT STRUCTURE WITH LOW DIELECTRIC CONSTANT MATERIAL BETWEEN CLOSELY SPACED APART METAL LINES

(75) Inventors: John Rongxiang Hu, San Jose, CA (US); Kai Zhang, Saratoga, CA (US); Senthil K. Arthanari, San Jose, CA (US); Hong-Qiang Michael Lu, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/892,250

(22) Filed: Jun. 27, 2001

(51) Int. Cl.$^7$ .................. H01L 21/76; H01L 21/4763
(52) U.S. Cl. .................. 438/444; 438/622; 438/623; 438/692; 438/733; 438/597
(58) Field of Search ................ 438/444, 692, 438/637, 672, 723, 733, 737, 627, 633, 628, 624, 597, 626, 631, 618, 645, 623, 629, 622

(56) References Cited

U.S. PATENT DOCUMENTS

| 3,012,861 A | 12/1961 | Ling | ................ 23/223.5 |
| 3,178,392 A | 4/1965 | Kriner | ................ 260/46.5 |
| 3,652,331 A | 3/1972 | Yamazaki | ................ 117/201 |

(List continued on next page.)

FOREIGN PATENT DOCUMENTS

| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63003437 | 1/1988 | ......... H01L/21/90 |
| JP | 2000-267128 | 9/2000 | ......... G02F/1/136 |
| WO | WO 99/41423 | 8/1999 | |

OTHER PUBLICATIONS

Bothra, S., et al., "Integration of 0.25 μm Three and Five Level Interconnect System for High Performance ASIC", *1997 Proceedings Fourteenth International VMIC Conference*, Santa Clara, CA, Jun. 10–12, 1997, pp. 43–48.
Dobson, C.D., et al., "Advanced SiO$_2$ Planarization Using Silane and H$_2$O$_2$", *Semiconductor International*, Dec. 1994, pp. 85–88.
McClatchie, S., et al., "Low Dielectric Constant Oxide Films Deposited Using CVD Techniques", *1998 Proceedings Fourth International DUMIC Conference*, Feb. 16–17, 1998, pp. 311–318.
Peters, Laura, "Low–k Dielectrics: Will Spin–On or CVD Prevai?", *Semiconductor International*, vol. 23, No. 6, Jun., 2000, pp. 108–110, 114, 116, 118, 122, and 124.
Peters, Laura, "Pursuing the Perfect Low–k Dielectric", *Semiconductor International*, vol. 21, No. 10, Sep., 1998, pp. 64–66, 68, 70, 72, and 74.

(List continued on next page.)

*Primary Examiner*—Matthew Smith
*Assistant Examiner*—Igne U. Anya
(74) *Attorney, Agent, or Firm*—John P. Taylor

(57) ABSTRACT

Protective caps are formed over horizontally closely spaced apart metal lines of an integrated circuit structure. Low k silicon oxide dielectric material is then deposited over and between the metal lines and over protective caps on the lines. After the formation of such low k material between the lines and over the caps, standard k dielectric material is deposited over the low k layer as a planarizing layer over low portions of the low k layer between the lines which may be lower than the top of the caps on the lines to prevent further etching or dishing of the low k layer of during planarizing. The structure is then planarized to bring the low k dielectric material down to the tops of the protective caps on the metal lines. A layer of standard k silicon material is then formed over the planarized low k layer and the caps to allow via formation without passing through the low k layer to avoid via poisoning.

18 Claims, 5 Drawing Sheets

U.S. PATENT DOCUMENTS

| | | | |
|---|---|---|---|
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,930,655 A | 7/1999 | Cooney, III et al. | |
| 5,935,868 A * | 8/1999 | Fang et al. | 438/692 |
| 5,939,763 A | 8/1999 | Hao et al. | 257/411 |
| 5,989,998 A | 11/1999 | Sugahara et al. | |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,145 A | 3/2000 | Suzuki et al. | |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,054,379 A | 4/2000 | Yau et al. | |
| 6,054,380 A * | 4/2000 | Naik | 438/624 |
| 6,063,702 A | 5/2000 | Chung | |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,215,087 B1 | 4/2001 | Akahori et al. | |
| 6,232,658 B1 | 5/2001 | Catabay et al. | 257/701 |
| 6,413,583 B1 * | 7/2002 | Moghadam et al. | 438/790 |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99-2, 1999, Abstract No. 746.

* cited by examiner

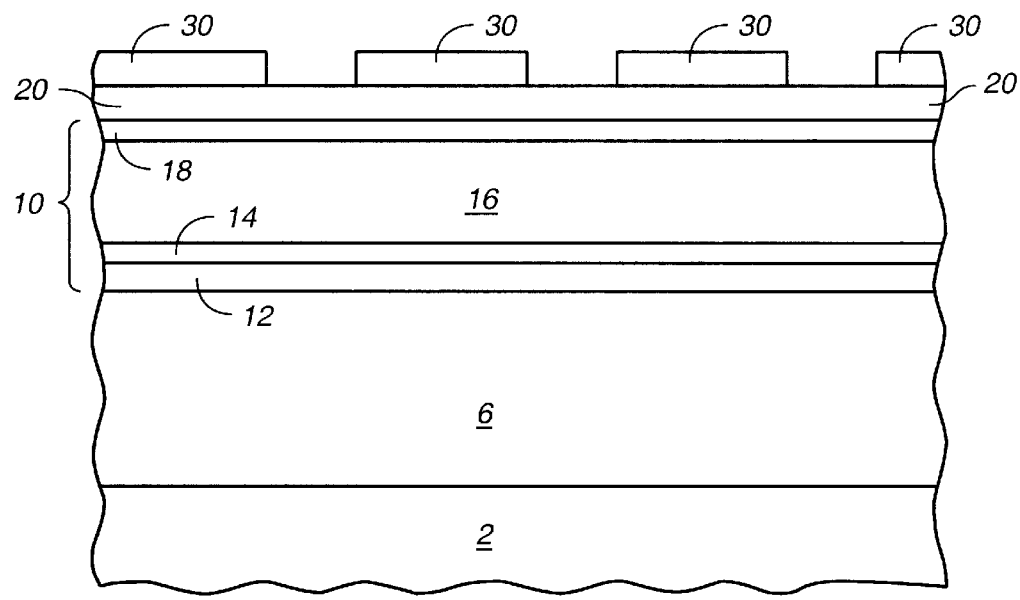
FIG._1
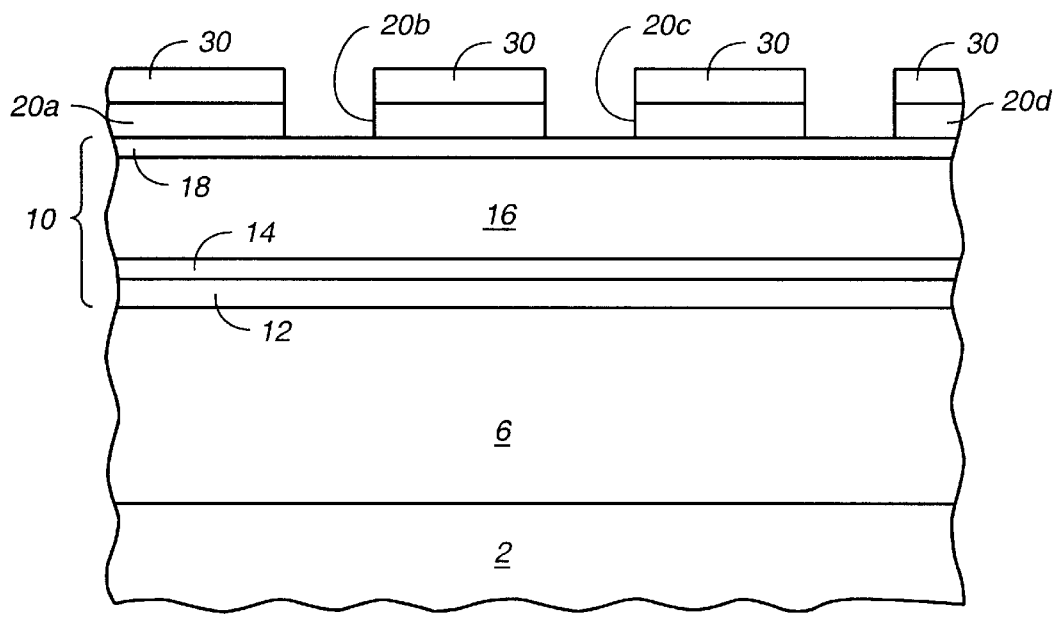
FIG._2

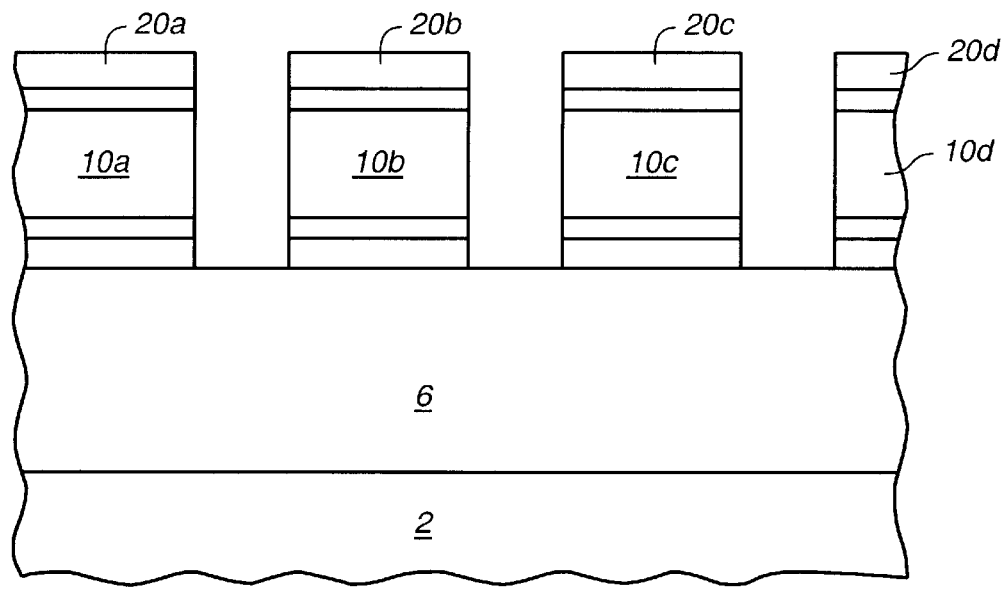
FIG._3
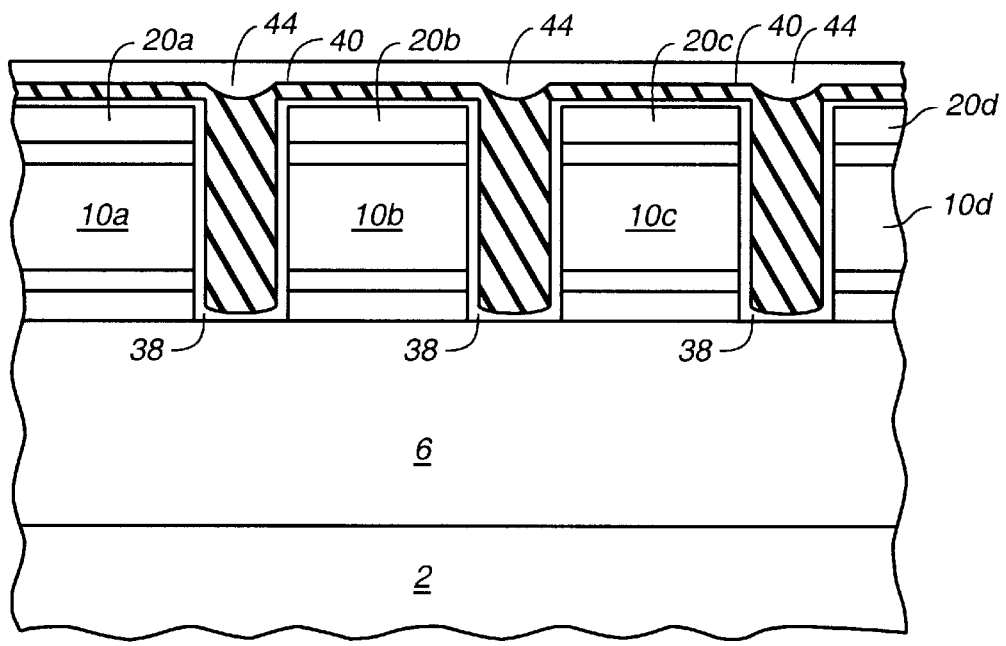
FIG._4

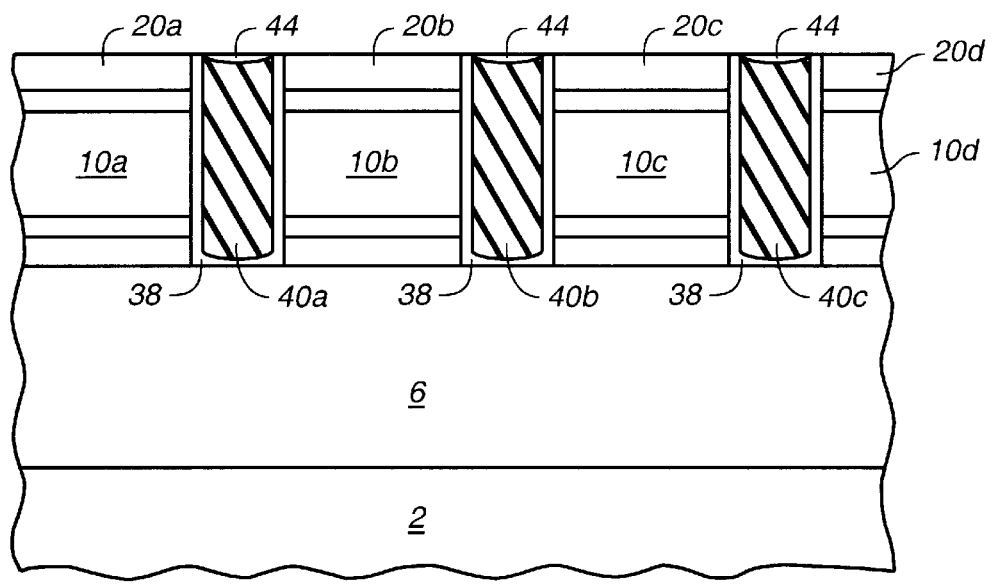
FIG._5
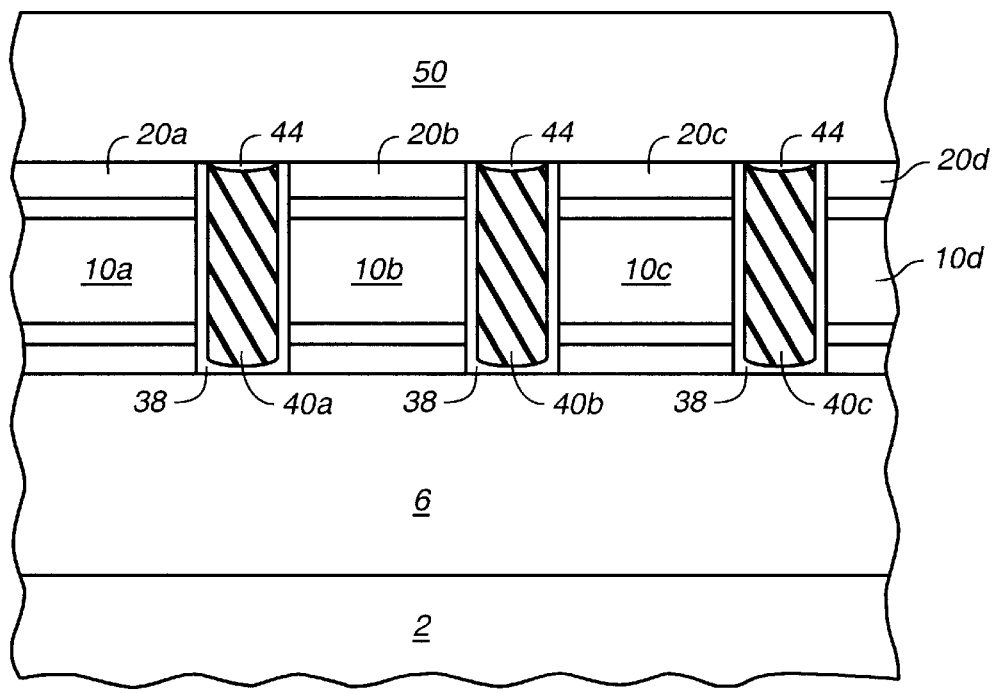
FIG._6

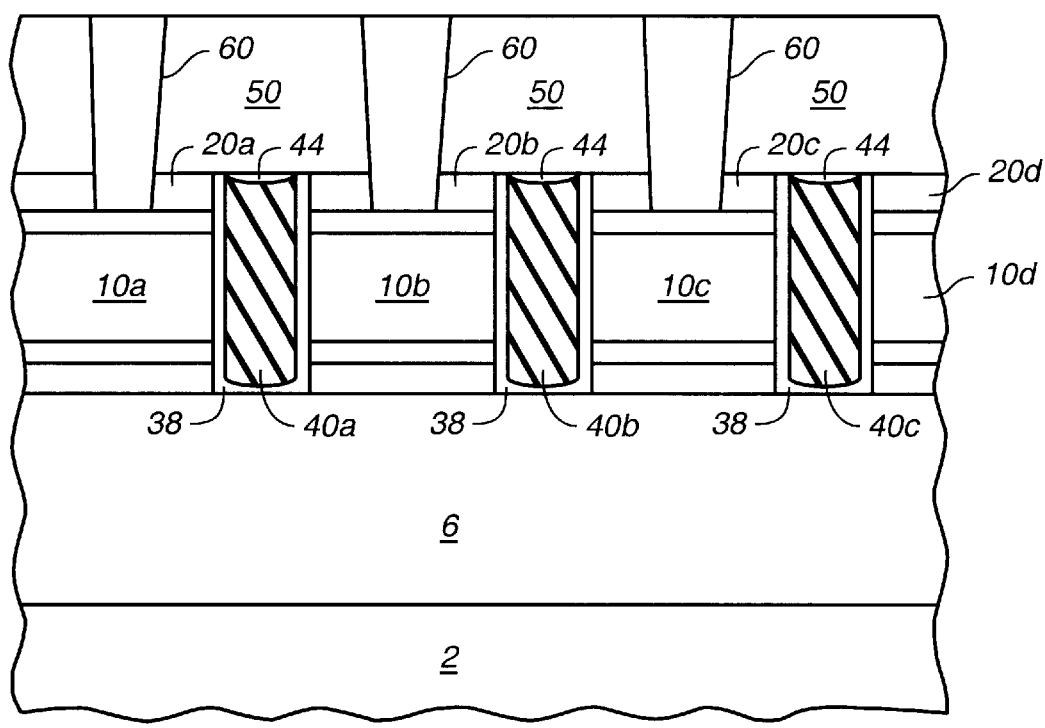
FIG._7

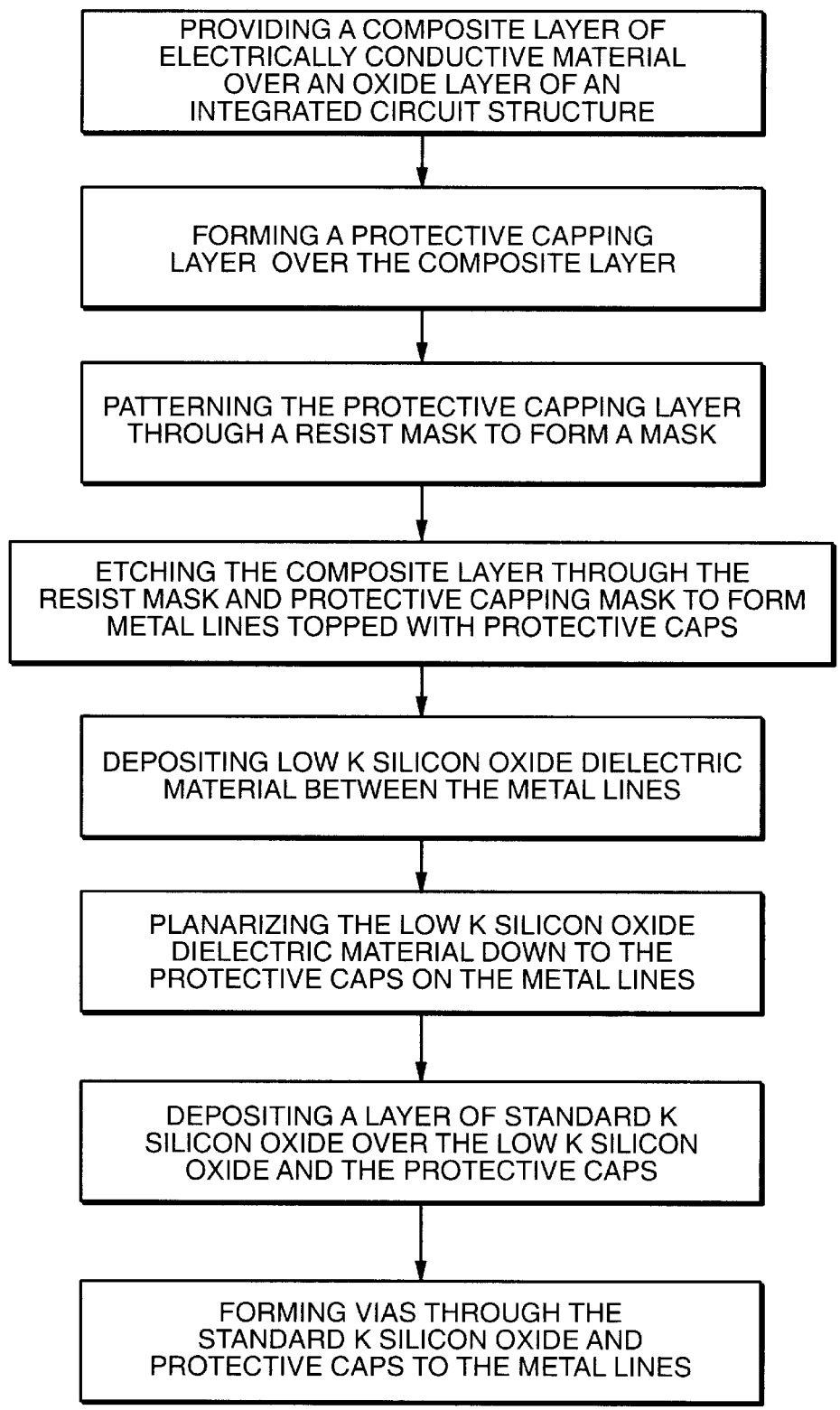
FIG._8

PROCESSING FOR FORMING INTEGRATED CIRCUIT STRUCTURE WITH LOW DIELECTRIC CONSTANT MATERIAL BETWEEN CLOSELY SPACED APART METAL LINES

CROSS REFERENCE TO RELATED APPLICATIONS

The subject matter of this application relates to the subject matter of copending U.S. patent application Ser. No. 09/704,200, filed on Oct. 31, 2000, entitled "PROCESS FOR FORMING INTEGRATED CIRCUIT WITH LOW DIELECTRIC CONSTANT MATERIAL BETWEEN CLOSELY SPACED APART METAL LINES", and assigned to the assignee of this application. The subject matter of Ser. No. 09/704,200 is hereby incorporated by reference.

The subject matter of this application relates to the subject matter of copending U.S. patent application Ser. No. 09/704,164, filed on Oct. 31, 2000, entitled "PROCESS FOR FORMING LOW K DIELECTRIC MATERIAL BETWEEN METAL LINES", and assigned to the assignee of this application. The subject matter of Ser. No. 09/704,164 is also hereby incorporated by reference.

The subject matter of this application relates to the subject matter of copending U.S. patent application Ser. No. 09/703,745, filed on Oct. 31, 2000, entitled "PROCESS FOR PLANARIZATION OF METAL-FILLED TRENCHES OF INTEGRATED CIRCUIT STRUCTURES", and assigned to the assignee of this application. The subject matter of Ser. No. 09/703,745 is also hereby incorporated by reference.

The subject matter of this application relates to the subject matter of copending U.S. patent application Ser. No. 09/703,616, filed on Oct. 31, 2000, entitled "PROCESS FOR CMP REMOVAL OF EXCESS TRENCH OR VIA FILLER METAL WHICH INHIBITS FORMATION OF CONCAVE REGIONS ON OXIDE SURFACE OF INTEGRATED CIRCUIT STRUCTURE", and assigned to the assignee of this application. The subject matter of Ser. No. 09/703,616 is also hereby incorporated by reference.

The subject matter of this application relates to the subject matter of copending U.S. patent application Ser. No. 09/605,380, filed on Jun. 27, 2000, entitled "COMPOSITE LOW DIELECTRIC CONSTANT FILM FOR INTEGRATED CIRCUIT STRUCTURE", and assigned to the assignee of this application. The subject matter of Ser. No. 09/605,380 is also hereby incorporated by reference.

The subject matter of this application relates to the subject matter of copending U.S. patent application Ser. No. 09/426,061, entitled "LOW DIELECTRIC CONSTANT SILICON OXIDE-BASED DIELECTRIC LAYER FOR INTEGRATED CIRCUIT STRUCTURES HAVING IMPROVED COMPATIBILITY WITH VIA FILLER MATERIALS, AND METHOD OF MAKING SAME", filed on Oct. 22, 1999, and assigned to the assignee of this application. The subject matter of Ser. No. 09/426,061 is hereby incorporated by reference.

The subject matter of this application relates to the subject matter of copending U.S. patent application Ser. No. 09/426,056, entitled "LOW K DIELECTRIC COMPOSITE LAYER FOR INTEGRATED CIRCUIT STRUCTURE WHICH PROVIDES VOID-FREE LOW K DIELECTRIC MATERIAL BETWEEN METAL LINES WHILE MITIGATING VIA POISONING", filed on Oct. 22, 1999, and assigned to the assignee of this application. The subject matter of Ser. No. 09/426,056 is also hereby incorporated by reference.

The subject matter of this application relates to the subject matter of copending U.S. patent application Ser. No. 09/425,552, filed on Oct. 22, 1999, entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", and assigned to the assignee of this application. The subject matter of Ser. No. 09/425,552 is also hereby incorporated by reference.

BACKGROUND OF THE INVENTION

1. Field of the Invention

This invention relates to integrated circuit structures with reduced capacitance. More particularly, this invention relates to the formation of an integrated circuit structure with a layer of low dielectric constant dielectric material formed between horizontally closely spaced apart metal lines of an integrated circuit structure to reduce horizontal capacitance between closely spaced apart metal lines, while via poisoning is mitigated by forming the vias down to the metal lines through a layer of standard k dielectric material formed over the low k dielectric layers formed between the metal lines. The presence of protective caps on the metal lines facilitates polishing the layer of low k dielectric material down to the level of the tops of the metal lines.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U. K. The Trikon process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Trikon process.

The use of this type of low k material has been found to result in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, the substitution of such low k dielectric materials for conventional silicon oxide insulation has not been without its own problems. It has been found that the subsequent formation of vias, or contact openings, through such low k dielectric material to the underlying conductive portions (such as metal lines, or contacts on an active device), can contribute to a phenomena known as via poisoning wherein filler material subsequently deposited in the via, such as a titanium nitride liner and tungsten filler material, fails to adhere to the via surfaces, resulting in unfilled vias. Apparently the presence of carbon in the low k dielectric material formed by the Trikon process renders the material more susceptible to damage during subsequent processing of the structure. For example, contact openings or vias are usually etched in the low k dielectric layer through a resist mask. When the resist mask is subsequently removed by an ashing process using oxygen, damage can occur to the newly formed via surfaces of the low k material resulting in such via poisoning.

In one embodiment in previously cited application Ser. No. 09/426,061, low k silicon oxide dielectric material having a high carbon doping level is formed in the high aspect ratio regions between closely spaced apart metal lines and then a second layer, also comprising a low k silicon oxide dielectric material, but having a lower carbon content is deposited over the first layer and the metal lines.

In one embodiment in previously cited application Ser. No. 09/426,056, a void-free low k silicon oxide dielectric material is formed in the high aspect regions between closely spaced apart metal lines by one of several processes, including the process used to form the first low k silicon oxide dielectric material described in the previously cited Ser. No. 09/426,061 patent application. A second layer of low k silicon oxide dielectric material is then deposited over the first layer and the metal lines by a process which deposits at a rate higher than the deposition rate of the void-free dielectric material. In a preferred embodiment, both of the layers are formed in the same vacuum chamber without an intervening planarization step.

In previously cited application Ser. No, 09/425,552, the use of a silicon oxynitride capping layer over metal lines was suggested to provide an antireflective coating which could also function as a etch stop layer for a CMP planarizing process used to remove from over the metal lines portions of low k dielectric material used to fill the space between the metal lines. A second layer of standard k dielectric material was then formed over the silicon oxynitride capping layer and the low k dielectric material between the metal lines. Vias formed through the second dielectric layer and the silicon oxynitride capping layer down to the metal lines do not intersect the low k dielectric material and via poisoning is thereby prevented.

In previously cited application Ser. No., 09/704,200, the use of a silicon nitride capping layer over metal lines was suggested to function as a etch stop layer for a CMP planarizing process used to remove, from over the metal lines, portions of low k dielectric material used to fill the space between the metal lines. A second layer of standard k dielectric material was then formed over the silicon nitride capping layer and the low k dielectric material between the metal lines. Vias formed through the second dielectric layer and the silicon nitride capping layer down to the metal lines do not intersect the low k dielectric material and via poisoning is thereby prevented.

Thus, it is highly desirable to provide an integrated circuit structure having a low k dielectric layer, and a process for making same, wherein a dielectric layer is formed comprising low k silicon oxide dielectric material for high aspect ratio regions between closely spaced apart metal lines while mitigating the poisoning of vias subsequently formed though a dielectric layer down to the metal lines.

SUMMARY OF THE INVENTION

In accordance with the invention, a protective capping layer is formed over a composite metal layer on an oxide layer of an integrated circuit structure formed on a semiconductor substrate. Both the protective capping layer and the composite metal layer are then patterned to form horizontally closely spaced apart composite metal lines, each having a protective cap thereon. Low k silicon oxide dielectric material, which exhibits void-free deposition properties in high aspect ratio regions between closely spaced apart metal lines, is then deposited over and between the closely spaced apart metal lines and over the protective caps on the composite metal lines. After the formation of such low k silicon oxide dielectric material between the closely spaced apart composite metal lines and over the protective caps thereon, a planarizing layer of dielectric material is optionally deposited over the layer of low k silicon oxide dielectric material. This layer of dielectric material acts a protective layer over portions of the layer of low k silicon oxide dielectric material between the composite metal lines which may be lower that the top surface of the protective caps on the composite metal lines to prevent further etching or dishing of those portions of the layer of low k silicon oxide dielectric material during a subsequent planarizing step.

The structure is then planarized by a process such as a CMP process to remove all low k dielectric material on the top surface of the protective caps over the composite metal lines and to bring the level of the low k material between the composite metal lines (and the protective dielectric layer on the low k material) down to the level of the tops of the protective caps on the metal lines. A layer of standard k dielectric material is then formed over the planarized low k dielectric layer and the protective caps. Vias are then formed through the layer of standard k dielectric material and through (or to) the protective caps (depending upon whether the protective cap is a dielectric or an electrically conductive material) to the composite metal lines. Since the vias are not formed through the low k dielectric material, formation of the vias does not contribute to poisoning of the vias. However, the presence of the low k silicon oxide dielectric material between the horizontally closely spaced apart metal lines reduces the horizontal capacitance between such composite metal lines.

BRIEF DESCRIPTION OF THE DRAWINGS

FIG. 1 is a fragmentary vertical cross-sectional view of an integrated circuit structure with a composite layer comprising a metal line formed on an oxide layer of an integrated circuit structure, and a protective capping layer formed over the composite layer, with a resist mask formed over the protective capping layer.

FIG. 2 is a fragmentary vertical cross-sectional view of the structure of FIG. 1 showing the protective capping layer etched through the resist mask.

FIG. 3 is a fragmentary vertical cross-sectional view of the structure of FIG. 2 with the composite layer etched through the resist mask and the already etched protective capping layer to form, over the oxide layer, composite metal lines, each capped with a protective cap.

FIG. 4 is a fragmentary vertical cross-sectional view of the structure of FIG. 3 showing a layer of low k silicon oxide dielectric material deposited over and between the capped composite metal lines after removal of the resist mask, and the formation of a planarizing dielectric layer formed over the low k dielectric layer to fill in dips in the upper surface of the low k dielectric layer and to protect those portions of the upper surface of the layer of low k silicon oxide dielectric material from dishing during the subsequent polishing step.

FIG. 5 is a fragmentary vertical cross-sectional view of the structure of FIG. 4 after planarization of the low k silicon oxide dielectric material and the planarizing dielectric layer down to the top of the protective caps on the composite metal lines.

FIG. 6 is a fragmentary vertical cross-sectional view of the structure of FIG. 5 after deposition of a layer of standard k dielectric material over the planarized low k silicon oxide dielectric material and the protective caps.

FIG. 7 is a fragmentary vertical cross-sectional view of the structure of FIG. 6 after formation of vias through the layer of standard k dielectric material and the protective caps down to the metal lines.

FIG. 8 is a flow sheet illustrating the process of the invention.

DETAILED DESCRIPTION OF THE INVENTION

The invention provides a structure and process wherein horizontal capacitance developed between closely spaced apart composite metal lines of an integrated circuit structure can be reduced without contributing to poisoning of vias subsequently formed down to such composite metal lines through dielectric material formed over the composite metal lines. In accordance with the invention, a protective capping layer is formed over horizontally closely spaced apart composite metal lines on an oxide layer of an integrated circuit structure formed on a semiconductor substrate. Low k silicon oxide dielectric material, which preferably exhibits void-free deposition properties in high aspect ratio regions between the closely spaced apart composite metal lines, is then deposited between the composite metal lines and over the protective caps on the composite metal lines.

After the formation of such low k silicon oxide dielectric material between the closely spaced apart metal lines and the over protective caps thereon, a layer of dielectric material is optionally deposited over the layer of low k silicon oxide dielectric material. This dielectric layer acts as a protective layer over portions of the layer of low k silicon oxide dielectric material between the composite metal lines which may be lower that the top surface of the protective caps on the composite metal lines to prevent further etching or dishing of those portions of the layer of low k silicon oxide dielectric material during the subsequent planarizing step.

The structure is then planarized to bring the level of the low k dielectric material down to the level of the tops of the protective caps on the composite metal lines. A layer of standard k dielectric material is then formed over the planarized low k silicon oxide dielectric layer and over the protective caps. Vias are then formed through the standard k dielectric layer and through the protective caps (when the protective caps constitute dielectric material) down to the metal lines. Since the vias are not formed through the low k dielectric material, formation of the vias does not contribute to poisoning of the vias. However, the presence of the low k silicon oxide dielectric material between the horizontally closely spaced apart metal lines reduces the horizontal capacitance between such metal lines.

The term "low k", as used herein is intended to define a dielectric constant of 3.5 or less, preferably 3.0 or less, while the term "standard k", as used herein is intended to define a dielectric constant of over 3.5, typically about 4.0.

The term "high aspect ratio", as used herein to define the space between closely spaced apart metal lines, is intended to define a height to width ratio of at least 2, and usually about 3. The term "closely spaced apart metal lines", as used herein is therefore intended to define metal lines on the same level having a horizontal space between them which has a "high aspect ratio", as that term is defined above.

Turning now to FIG. 1, an integrated circuit structure 2 is shown with an oxide layer 6 such as a layer of silicon oxide conventionally formed over integrated circuit structure 2. Integrated circuit 2 includes semiconductor devices such as transistors formed in a semiconductor substrate, with contact openings (not shown) formed through oxide layer 6 from contacts on such devices. Structure 2 may further comprises lower layers of metal lines or interconnects formed therein with vias (not shown) formed through oxide layer 6 from such lower metal lines.

Formed over oxide layer 6 is shown a conventional electrically conductive composite layer 10 which typically may comprise a first layer 12 of a metal such as titanium to provide a conductive metal contact to underlying electrically conductive materials of the integrated circuit structure (such as metal-filled vias or contact openings) and, particularly in the case of titanium, to facilitate bonding of the composite metal lines or interconnects to such underlying electrically conductive materials. Over first layer 12 is formed a second layer 14 of a material such as titanium nitride which serves as a protective or barrier layer of electrically conductive material to isolate main electrically conductive metal layer 16 from interaction with underlying materials such as silicon or the titanium layer.

Typically main electrically conductive metal layer 16 will comprise a metal or metals such as comprise aluminum or an aluminum/copper alloy. Top layer 18, also typically formed of titanium nitride in the illustrated embodiment, serves the same purpose as titanium nitride layer 14, i.e., to provide an electrically conductive layer which will metallurgically isolate main aluminum layer 16 from other materials in the integrated circuit structure.

It should be noted that while composite layer 10 is illustrated and described as a typical four layer composite layer, as is well known to those skilled in the art, other combinations of layers of metals and electrically conductive metal compounds could be used for the formation of electrically conductive composite layer 10. In fact, layer 10, while described herein as a "composite layer" or a "composite metal layer", may in fact comprise only a single metal layer. The use of the terms "composite layer" and "composite metal layer" should not, therefore, be construed as limited to the four illustrated electrically conductive layers. It should also be noted that the terms "metal lines" and "composite metal lines", as interchangeably used herein for the composite metal layer after patterning to form lines, includes the presence of layers of electrically conductive metal compounds such as titanium nitride. Therefore, it will be understood that the terms "composite metal lines" and "metal lines", as used herein, are not limited to only metals, but includes electrically conductive metal compounds as well.

In accordance with the invention, over the composite metal layer is formed a protective capping layer 20 which may, depending on the composition of layer 20, act additionally as an etch stop layer during a subsequent CMP process to remove all low k dielectric material over the protective caps to be formed over the metal lines, as will be discussed below.

In one embodiment, protective capping layer 20 may comprise a dielectric material such as a standard k silicon oxide layer (i.e., a silicon oxide having a dielectric constant of about 4 or higher), or silicon carbide. The advantage of using a dielectric material such as silicon oxide or silicon carbide for protective capping layer 20 is that protective capping layer 20 may also function as a hard mask layer during patterning of the composite metal layer to form the metal lines or interconnects, thus enabling one to use a thinner resist mask to enhance the accuracy of the patterning step. The protective caps to be formed from protective capping layer 20 over the metal lines may further function as an etch stop layer during a subsequent CMP process for planarizing the low k dielectric material to be formed between the metal lines, particularly when the dielectric material chosen for protective capping layer 20 is a different material such as silicon carbide, as will be seen below. However, it should be noted that even when the low k dielectric material comprises a carbon-containing silicon oxide dielectric material, the use of a standard k silicon oxide dielectric material as the protective capping layer may still enable the protective cap to function as an etch stop layer for CMP planarization of such a low k dielectric material because of the higher etch rate of low k carbon-containing silicon oxide dielectric material than standard k silicon oxide dielectric material.

In another embodiment protective capping layer 20 may comprise a layer of metal such as tungsten, tantalum, or titanium (or an electrically conductive metal compound such as tantalum nitride) formed over the composite layer. The use of metals such as tungsten or titanium for capping layer 20 is advantageous because of the compatibility of such a protective capping layer with the metals conventionally used to fill the via which will be formed down to the protective caps over the metal lines to be formed from patterning of composite metal layer 20.

The use of a metal (or an electrically conductive metal compound such as tantalum nitride) as the protective capping layer over the composite metal layer also permits the subsequent protective caps formed over the metal lines, after patterning of the protective capping layer and the composite metal layer, to further function as an etch stop layer during CMP planarizing of the layer of low k dielectric material to be formed between the metal lines. Such metal protective caps may also function as an etch stop layer during the subsequent etching of the via down to the protective cap through a standard k dielectric layer to be formed over the metal lines.

Protective capping layer 20 preferably ranges in thickness from about 50 nanometers (nm) to about 300 nm. to provide an adequate thickness for use of the caps as a CMP stop layer. When protective capping layer 20 comprises standard k silicon oxide, protecting capping layer 20 may be formed over titanium nitride upper barrier layer 18 by any conventional method, such as by reaction between TEOS (tetraethyl orthosilicate) and oxygen (e.g., a mixture of $O_2$ and $O_3$) or by reaction of silane with an oxidizing agent such as $O_2$, $O_3$, $NO$, $NO_2$, $H_2O_2$, and mixtures of same. When protective capping layer 20 comprises silicon carbide, the layer may be formed by decomposition of trimethylsilane gas in a plasma environment.

When electrically conductive materials such as metals or metal compounds (e.g., tungsten, tantalum, or titanium, or tantalum nitride) are used to form a metal (or metal compound) protective capping layer, they may be deposited using any conventional deposition process, such as, for example, CVD or PVD.

As seen in FIG. 1, over protective capping layer 20 is formed a resist mask 30 which is patterned to form a series of metal lines or interconnects from underlying composite layer 10. As shown in FIG. 2, when protective capping layer 20 comprises a dielectric material, it may be first etched through the openings in resist mask 30 to reproduce the pattern of openings in protective capping layer 20. A plasma etcher, such as a TEL, a LAM Exelan, or an AMAT DPS, using a dielectric etch system for silicon oxide or silicon carbide, may be used for this selective etching of protective capping layer 20. FIG. 2 shows the result of this etching step wherein the pattern in resist mask 30 has now been reproduced in protective capping layer 20, as shown at 20a–20d in FIG. 2.

This preliminary etching of protective capping layer 20, in turn, permits remaining protective capping portions or caps 20a–20d to act as an etch mask for composite layer 10 which constitutes a further advantage for the use of dielectric material as protective capping layer 20 in the structure of the invention. The use of protective capping layer 20 as an etch mask means that resist mask 30 can be initially constructed thinner (e.g., about 4000 Å instead of about 6000 Å) than if only resist mask 30 were to be used for the etching of composite layer 10. The formation of a thinner resist mask 30, in turn, results in more accurate formation of resist mask 30.

After the etching of the dielectric material comprising protective capping layer 20, the underlying layers 12, 14, 16, 18 comprising composite layer 10 may be etched through resist mask 30 and the openings between remaining portions 20a–20d of protective capping layer 20 (i.e., through the etch mask formed by the previous etching of layer 20) with the etch stopping at oxide layer 6. Any etch chemistry selective to the dielectric material comprising protective capping layer 20, i.e. etch chemistry which will etch the individual layers of composite layer 10 in preference to the dielectric material comprising protective capping layer 20, may be used to etch composite layer 10, such as, for example, the $Cl_2$ and $BCl_3$ etch chemistry described in previously cited Ser. No. 09/425,552.

Alternatively, when protective capping layer comprises a metal such as tungsten or titanium, i.e., the same metal used to form one of the layers of composite metal layer 10, resist mask 30 will be used to pattern both protective capping layer 20 and composite metal layer 10 at the same time.

In either case, this etching of the four illustrated layers 12, 14, 16, and 18 comprising composite layer 10 forms electrically conductive composite lines which will herein after be referred to and illustrated as metal lines 10a–10d. Metal lines 10a–10d are capped by protective caps 20a–20d, as shown in FIG. 3. Resist layer 30 is then removed by a conventional ashing system, leaving on oxide layer 6 a system of metal lines, each topped with a protective cap, as exemplified by the metal lines 10a–10d topped by protective caps 20a–20d.

After formation of metal lines 10a–10d capped with protective caps 20a–20d, a barrier layer 38 of conventional (standard k) dielectric material may be deposited over the entire structure to protect the subsequently deposited low k silicon oxide dielectric material to be described below from direct contact with the underlying metal lines. Barrier layer 38 may range in thickness from about 3 nm (the minimum amount for the desired protection) up to a maximum thickness of about 10 nm (beyond which the benefits of the low k dielectric material to be formed thereover could be negatively impacted).

A layer 40 of low k silicon oxide dielectric material is then deposited over barrier layer 38 in the regions between metal lines 10a–10d down to oxide layer 6, and over the tops of protective caps 20a–20d, as shown in FIG. 4. Low k silicon oxide dielectric layer 40 comprises any silicon oxide dielectric material having a dielectric constant of 3.5 or less, preferably 3.0 or less, and capable of forming void-free dielectric material in the regions between closely spaced apart metal lines, i.e., in openings having a high aspect ratio of at least 2, usually at least 3.

Such void-free low k silicon oxide dielectric material may be deposited between metal lines 10–10d and over protective caps 20a–20d by reacting hydrogen peroxide with a carbon-substituted silane such as methyl silane, as described in the aforementioned article by L. Peters, and described in general for silane and peroxide reactions in Dobson U.S. Pat. No. 5,874,367, the subject matter of which is hereby incorporated by reference. The void-free low k silicon oxide dielectric material may also be deposited by reacting a mild oxidant such as hydrogen peroxide with the carbon-substituted silane materials disclosed in Aronowitz et al. Ser. No. 09/274,457, filed on Mar. 22, 1999, and assigned to the assignee of this application, the subject matter of which is also hereby incorporated by reference. Other low k silicon oxide dielectric materials may also be used in the process of the invention, and the use of the above described low k silicon oxide dielectric material in the process of the invention should be considered to be by way of illustration and not by way of limitation.

Low k silicon oxide dielectric layer 40 is deposited in sufficient quantity to substantially fill of the space between metal lines 10a–10d. While it is not required that low k dielectric layer 40 cover protective caps 20a–20d, the deposition of a sufficient amount of low k dielectric layer 40 to cover protective caps 20a–20d usually insures that the spaces between metal lines 10a–10d, i.e., the regions where it is desirable to suppress horizontal capacitance are substantially filled with the low k silicon oxide dielectric material. However, it has been found that the portions between metal lines 10a–10d are sometimes not completely filled with low k dielectric material, even when the low k silicon oxide dielectric material is formed in sufficient quantity to cover protective caps 20a–20d.

Therefore, as shown in FIG. 4, in accordance with one aspect of the invention, a planarizing dielectric layer 44 is formed over low k layer 40. Dielectric layer 44 preferably comprises a standard k dielectric material (which will etch more slowly than low k dielectric layer 40), and most preferably comprises the same dielectric material as protective caps 20a–20d, when protective caps 20a–20d comprise a dielectric material. Layer 44 serves a dual purpose. First of all, as the polishing step begins to reach the level of the protective caps 20a–20d on the metal lines, planarizing dielectric layer 44 serves to protect the exposed upper surface of low k dielectric layer 40 between the metal lines to prevent the polishing step from further forming dished in or concave in the upper surface of low k dielectric layer 40, since the low k dielectric layer tends to polish faster than protective caps 20a–20d on metal lines 10a–10d. Planarizing layer 44 also serves to provide a more planar surface after the polishing step, i.e., a surface without dimples or valleys where the low k material did not completely fill the space between the lines.

After deposition of layer 40 of low k silicon oxide dielectric material, and planarizing dielectric layer 44, the structure may be subject to a anneal or heat-treatment prior to planarization, such as by chemical mechanical polishing (CMP). The structure may be removed from the deposition reactor and heat treated at a temperature of between about 300° C. to about 500° C., typically from about 400° C. to about 450° C. for about 2–5 minutes, i.e., subject to a rapid thermal anneal (RTA). Conventional annealing, i.e., baking at the same temperature for up to 60 minutes, may also be used, but is not preferred due to the adverse effect on the thermal budget of the structure.

The annealed structure is then moved to a planarization chamber or apparatus where all of the low k dielectric material on the upper surface of protective caps 20a–20d is removed, leaving only low k silicon oxide dielectric material 40a–40c with remaining portions of planarizing dielectric layer 44 thereon in the respective regions between metal lines 10a–10d, as shown in FIG. 5. Such excess low k dielectric material over protective caps 20a–20d can be removed by a chemical mechanical polishing (CMP) process, using, for example, a high selectivity CMP slurry which is selective to the material constituting protective caps 20a–20d, i.e., will etch the low k silicon oxide dielectric material of layer 40 in preference to the material constituting protective caps 20a–20d. The low k silicon oxide dielectric material is then removed by the CMP process until the top surface of the protective caps 20a–20d is exposed which then can function as an etch stop (even when protective caps 20a–20d constitute standard k silicon oxide). This constitutes yet a further function of protective caps 20a–20d. Optionally, at this point, protective caps 20a–20d may be removed from metal lines 10a–10d, for example, when protective caps 20a–20d constitute silicon carbide.

After planarization of the structure by removal of the excess low k dielectric material (and optional removal of protective caps 20a–20d), the structure is moved to a deposition apparatus where a further layer 50 of conventional (standard k) silicon oxide dielectric material is deposited over the planarized low k silicon oxide dielectric material of layer 40 and over the tops of protective caps 20a–20d (if present), as shown in FIG. 6. In accordance with a preferred embodiment of the invention, layer 50 of standard k silicon oxide dielectric material is deposited over planarized low k dielectric layer 40 by any conventional deposition process including, by way of example only, TEOS (tetraethyl orthosilicate) and $O_2/O_3$, fluorinated silicon glass (FSG) using high density plasma (HDP), and plasma enhanced chemical vapor deposition (PECVD) using silane and $O_2$. The thickness of layer 50 will depend upon the desired overall thickness of dielectric material separating metal lines 10a–10d from the next layer of integrated circuit material such as another layer of metal lines. Typically the thickness of standard k silicon oxide dielectric layer 50 deposited over the structure will range from about 300 nm to about 700 nm. It will be noted that the upper surface of oxide layer 50 is planar due to the conformal nature of the deposition and the underlying planar surface formed by protective caps 20a–20d, low k dielectric material 40a–40c in the space between the metal lines, and the remaining portions of planarizing layer 44.

After formation of standard k silicon oxide layer 50, an optional further planarization step may be carried out if the process chosen for deposition of dielectric layer 50 doe not result in a planarized top surface on layer 50. A via resist mask (not shown) may then be formed over silicon oxide dielectric layer 50 and vias 60 may then be cut through dielectric layer 50 and, also through protective caps 20a–20d (when underlying protective caps 20a–20d constitute a dielectric material), to the tops of metal lines 10a–10d, as shown in FIG. 7. Alternatively, when protective caps 20a–20d constitute a metal such as tungsten, tantalum, or titanium (or an electrically conductive compound such as tantalum nitride), vias 60 need only be cut through dielectric layer 50 to the tops of protective caps 20a–20d.

Vias 60 are etched using, for example, a $CF_4$, $C_4F_8$, and $CHF_3$ plasma etch system to etch oxide layer 50 down to the top surface of protective caps 20a–20d, when protective caps 20a–20d are formed from either a metal or from silicon carbide. If protective caps 20a–20d constitute silicon carbide, the etchant is then changed to a $CF_4$, $CH_2F_2$, $H_2$, and $O_2$ etchant system to etch through the exposed portions of silicon carbide caps 20a–20d down to metal lines 10a–10d. If caps 20a–20d are formed from silicon oxide, the same etch used to form vias 60 through dielectric layer 50 is merely continued until the top surface of metal lines 10a–10d is exposed. When protective caps 20a–20d are formed from metal (or an electrically conductive metal compound), the via etch is simply terminated when the top surface of metal caps 20a–20d is reached. Vias 60 may then be filled with appropriate electrically conductive filler material, e.g, a titanium nitride liner and a tungsten filler material, as is well known to those skilled in the art.

It should be noted that regardless of the material used to form protective caps 20a–20d, it is important that sufficient over etching of either protective caps 20a–20d (when protective caps 20a–20d are formed from metal) or the top surface of metal lines 10a–10d (when protective caps 20a–20d constitute a dielectric material) occurs to assure that electrical contact can be established between the bottom of vias 60 and substantially all of the metal lines 10a–10d beneath vias 60.

The resultant structure, as shown in FIG. 7, is formed with low k silicon oxide dielectric material occupying substantially the entire region between the metal lines, with the second planarizing dielectric layer formed over the layer of low k material serving to inhibit any further dishing of the surface of the low k layer during the polishing step, so that horizontal capacitance between the closely spaced apart metal lines is suppressed or reduced. Furthermore, due to the presence of the protective cap material on the upper surfaces of the metal lines, functioning as a buffer or barrier material between sidewalls of the vias and the low k silicon oxide dielectric material (when protective caps 20a–20d are formed from a dielectric material such as silicon oxide or silicon carbide), the low k silicon oxide dielectric material can be deposited in the regions between closely spaced apart metal lines up to the very top of the metal lines without surfaces of such low k silicon oxide dielectric material becoming subsequently exposed by formation of the vias down to the metal lines. Via poisoning due to exposure of portions of the low k silicon oxide dielectric material during via formation is thereby suppressed or eliminated, because the sidewalls of the vias only cut through the layer of standard k silicon oxide material (and through the protective cap material when the cap is a dielectric material), i.e., the vias do not pass through the low k silicon oxide dielectric material (regardless of the cap material).

The following will serve to further illustrate the invention when protective caps 20a–20d constitute a silicon carbide dielectric material. A 90 nm thick silicon carbide capping layer may be deposited over an electrically conductive composite layer previously formed over an oxide layer on an eight inch diameter silicon substrate. The silicon carbide capping layer is deposited by decomposition of trimethylsilane or tetramethylsilane in plasma. The underlying composite layer can consist of a titanium metal bottom adhesion layer, a lower titanium nitride barrier layer over the titanium layer, a main aluminum/copper alloy layer, and a top titanium nitride barrier layer. A resist mask, patterned to form a series of metal lines or interconnects, is then formed over the silicon carbide capping layer. The silicon carbide capping layer is then etched through the resist mask using a dielectric etch system to expose the underlying titanium nitride top barrier layer, i.e., the uppermost layer of the electrically conductive composite layer.

The titanium nitride layer is then etched through to the aluminum/copper alloy layer, using etch chemistry selective to silicon carbide to thereby permit the previously etched silicon carbide layer to function as a mask to form the metal lines. The aluminum/copper alloy layer, the lower titanium nitride barrier layer, and the titanium metal layer are then etched to form the silicon carbide-capped metal lines, with the etch stopping when the underlying oxide layer is reached. The result will be a pattern of silicon carbide-capped metal lines having a horizontal spacing there between of about 200 nm, and a height of about 500 nm, resulting in regions between the closely spaced apart metal lines having an aspect ratio of about 2.5.

After the etching of the composite layer is completed to form the pattern of silicon carbide-capped metal lines or interconnects, the resist mask can be removed with a conventional ashing process, i.e., using $O_2$ with a plasma. A thin protective layer of standard k silicon oxide may then be formed over the capped metal lines.

A layer of low k silicon oxide dielectric material can then be deposited in the regions between the closely spaced apart metal lines by flowing vaporous carbon-doped silane and vaporous hydrogen peroxide into the deposition chamber, while the chamber is maintained at a temperature of 0° C. until the deposition of low k silicon oxide dielectric material reaches the top of the silicon carbide caps on the metal lines. The structure is then heat treated for 3 minutes at a temperature of between about 400–450° C., following which a planarizing layer of silicon carbide is deposited over the low k layer.

The annealed structure is then moved to a CMP chamber or apparatus where all of the low k dielectric material on the upper surface of the silicon carbide caps is removed, using a basic (pH 9–12) colloidal or fumed silica CMP slurry selective to silicon carbide, until the top surface of the silicon carbide caps is exposed, i.e., the silicon carbide caps function as an etch stop. This leaves the low k silicon oxide dielectric material (with remaining portions of the planarizing layer of silicon carbide thereon) only in the respective regions between the metal lines. A 500 nm layer of standard k silicon oxide dielectric material is then deposited over the structure using PECVD.

After formation of the standard k silicon oxide dielectric layer over the low k silicon oxide dielectric layer and the remaining portions of the planarizing silicon carbide layer, and over the exposed silicon carbide caps over the metal lines, the substrate is removed from the reactor. A via resist mask is then applied to the upper surface of the PECVD oxide layer. Vias are cut through the PECVD standard k silicon oxide layer, using $CF_4$, and $O_2$, stopping at the silicon carbide cap on the metal line. The etchant system is then changed to a dielectric system to etch silicon carbide selective to titanium nitride until the bottom of the vias reaches the titanium nitride top barrier layer of the metal lines.

The vias can then be filled by first sputtering a protective coating of titanium nitride over the surfaces of the vias and then filling the vias with tungsten. When the substrate is then examined in cross-section by scanning electron microscopy (SEM) to determine how many of the vias were filled with tungsten, it will be found that substantially all of the vias will be filled with tungsten, indicating an absence of via poisoning.

Thus the invention provides a process wherein low k silicon oxide dielectric material occupies substantially the entire region between closely spaced apart metal lines so that horizontal capacitance between the closely spaced apart metal lines is suppressed or reduced, while via poisoning is mitigated by forming the vias down to the metal lines through a layer of standard k dielectric material formed over the low k dielectric layers formed between the metal lines.

The presence of protective caps on the metal lines facilitates polishing the layer of low k dielectric material down to the level of the tops of the metal lines.

When this protective cap layer on the metal lines is a dielectric material, it further functions as a buffer material between the sidewalls of the vias and the low k silicon oxide dielectric material. Thus, the low k silicon oxide dielectric material can be deposited in the regions between closely spaced apart metal lines up to the very top of the metal lines without surfaces of such low k silicon oxide dielectric material becoming subsequently exposed by formation of the vias down to the metal lines. Since the vias do not pass through the low k silicon oxide dielectric material, via poisoning due to exposure of portions of the low k silicon oxide dielectric material during via formation is thereby suppressed or eliminated, because the sidewalls of the vias only cut through the layer of standard k silicon oxide dielectric material and through the protective cap buffer material (when the protective cap is formed of dielectric material), or only to the top of the protective cap (when the protective cap is a metal).

Furthermore, the planarizing layer of dielectric material formed over the low k layer prior to the CMP step to remove low k dielectric material from the tops of the protective caps protects the underlying surface of the low k dielectric material between the metal lines to inhibit further polishing of such low k dielectric material to form dished out portions. Prevention of formation of such dished out portions in the surfaces of the low k dielectric material ensures that substantially all of the space between the metal lines will be occupied by low k dielectric material to thereby reduce horizontal capacitance between the metal lines.

Having thus described the invention what is claimed is:

1. A process for forming an integrated circuit structure on a semiconductor substrate and characterized by reduced horizontal capacitance between closely spaced apart metal lines which comprises:
   a) forming, on an oxide layer of an integrated circuit structure on a semiconductor substrate, closely spaced apart metal lines with protective caps thereon, said protective caps comprising a material selected from the group consisting of standard k silicon oxide, silicon carbide, and a metal;
   b) depositing low k silicon oxide dielectric material between said closely spaced apart metal lines and over said protective caps on said metal lines;
   c) planarizing said low k silicon oxide dielectric material down to the level of a top surface of said protective caps; and
   d) depositing a layer of standard k silicon oxide over said planarized low k silicon oxide dielectric and said protective caps;

including the further step of forming a planarizing layer of standard k dielectric material over said low k silicon oxide dielectric material prior to said planarizing step.

2. The process of claim 1 wherein said step of forming closely spaced apart metal lines with protective caps on an oxide layer comprises the further steps of:
   a) forming a composite layer of electrically conductive material on an oxide layer of an integrated circuit structure on a semiconductor substrate;
   b) forming a protective capping layer over said composite layer;
   c) patterning said protective capping layer; and
   d) patterning said composite layer through said patterned protective capping layer to form said closely spaced apart metal lines capped with said protective caps on said oxide layer.

3. The process of claim 2 wherein said step of forming a protective capping layer over said composite layer further comprises forming from about 300 Å to about 1200 Å of protective capping material over said composite layer.

4. The process of claim 3 including the further step of forming vias through said layer of standard k silicon oxide and said protective caps down to said closely spaced apart metal lines.

5. A process for forming an integrated circuit structure on a semiconductor substrate and characterized by reduced horizontal capacitance between closely spaced apart metal lines which comprises:
   a) forming a composite layer of electrically conductive material on an oxide layer of an integrated circuit structure on a semiconductor substrate;
   b) forming a protective capping layer over said composite layer, said protective capping layer comprising a material selected from the group consisting of standard k silicon oxide, silicon carbide, tungsten, tantalum, titanium and tantalum nitride;
   c) patterning said protective capping layer;
   d) patterning said composite layer through said patterned protective capping layer to form on said oxide layer closely spaced apart metal lines topped with protective caps;
   e) depositing low k silicon oxide dielectric material between said closely spaced apart metal lines and over said protective caps on said metal lines;
   f) planarizing said low k silicon oxide dielectric material down to the level of a top surface of said protective caps;
   g) depositing a layer of standard k silicon oxide over said planarized low k silicon oxide dielectric and said protective caps; and
   h) forming vias through said layer of standard k silicon oxide and said protective caps down to said closely spaced apart metal lines;
   wherein after said step of depositing said low k silicon oxide dielectric material a planarizing layer of standard k dielectric material is deposited over said low k silicon oxide dielectric material to fill in any low regions in the surface of said low k silicon oxide dielectric material prior to said planarizing step.

6. The process of claim 5 wherein said step of forming a protective capping layer over said composite layer further comprises forming from about 300 Å to about 1200 Å of protective capping material over said composite layer.

7. The process of claim 6 wherein said step of forming a composite layer of electrically conductive material on an oxide layer of an integrated circuit structure on a semiconductor substrate comprises the further steps of:

a) forming a first barrier layer of electrically conductive material over said oxide layer;

b) forming a main metal layer on said first barrier layer; and c) forming a second barrier layer of electrically conductive material on said main metal layer.

8. The process of claim 7 wherein said step of forming a main metal layer comprises forming a main metal layer from aluminum or an alloy of aluminum and copper.

9. The process of claim 7 wherein said first and second barrier layers of electrically conductive material each comprise titanium nitride.

10. The process of claim 5 wherein said step of forming a composite layer of electrically conductive material on an oxide layer of an integrated circuit structure on a semiconductor substrate comprises the further steps of:

a) forming over said oxide layer a first layer of metal capable of providing a conductive metal contact to underlying electrically conductive materials of said integrated circuit structure;

b) forming a first barrier layer of electrically conductive material over said first layer of metal;

c) forming a main metal layer on said first barrier layer; and d) forming a second barrier layer of electrically conductive material on said main metal layer.

11. The process of claim 10 wherein said step of forming over said oxide layer a first layer of metal capable of providing a conductive metal contact to underlying electrically conductive materials of said integrated circuit structure further comprises forming a layer of titanium over said oxide layer.

12. The process of claim 5 wherein said step of depositing low k silicon oxide dielectric material between said closely spaced apart metal lines and over said protective caps on said metal lines further comprises reacting carbon-substituted silicon with a mild oxidant to form said low k silicon oxide dielectric material.

13. The process of claim 5 wherein said step of depositing low k silicon oxide dielectric material between said closely spaced apart metal lines and over said protective caps on said metal lines further comprises reacting carbon-substituted silane with hydrogen peroxide to form said low k silicon oxide dielectric material.

14. The process of claim 13 wherein said carbon-substituted silane comprises a carbon-substituted silane having only primary hydrogens bonded to the carbon atoms and having the formula: $SiH_x((C)_y(CH_3)_z)_{(4-x)}$, where x ranges from 1 to 3, y is an integer from 1 to 4 for a branched alkyl group and from 3 to 5 for a cyclic alkyl group, and z is $2y+1$ for a branched alkyl group and $2y-1$ for a cyclic alkyl group.

15. The process of claim 5 wherein said step of planarizing said low k silicon oxide dielectric material down to the level of a top surface of said protective caps further comprises chemically/mechanically polishing said low k silicon oxide dielectric material.

16. A process for forming an integrated circuit structure on a semiconductor substrate and characterized by reduced horizontal capacitance between closely spaced apart metal lines thereon without poisoning of vias formed through dielectric material to such metal lines which process comprises:

a) forming, on an oxide layer of an integrated circuit structure on a semiconductor substrate, a composite layer of electrically conductive material by the steps of:

i) forming a first barrier layer of electrically conductive material over said oxide layer;

ii) forming a main metal layer on said first barrier layer; and iii) forming a second barrier layer of electrically conductive material on said main metal layer;

b) forming over said composite layer a protective capping layer comprising a material selected from the group consisting of standard k silicon oxide, silicon carbide, tungsten, tantalum, titanium, and tantalum nitride;

c) patterning said protective capping layer;

d) patterning said composite layer through said patterned protective capping layer to form, on said oxide layer, closely spaced apart metal lines having protective caps thereon;

e) depositing between said closely spaced apart metal lines and over said protective caps on said metal lines low k silicon oxide dielectric material formed by reacting carbon-substituted silane with hydrogen peroxide;

f) depositing over said low k silicon oxide dielectric material a planarizing layer of standard k dielectric material to fill in any low regions in the surface of said low k silicon oxide dielectric material;

g) planarizing said low k silicon oxide dielectric material down to the level of a top surface of said protective caps by chemically/mechanically polishing said low k silicon oxide dielectric material;

h) depositing a layer of standard k silicon oxide dielectric material over said planarized low k silicon oxide dielectric material and said protective caps; and i) forming vias through said layer of standard k silicon oxide dielectric material to provide electrical contact to said metal lines without contacting said low k silicon oxide dielectric material, whereby poisoning of said vias by said process is avoided.

17. The process of claim 16 wherein said protective caps comprise an electrically conductive material selected from the group consisting of titanium, tantalum, tungsten, and tantalum nitride, and said step of forming vias through said layer of standard k silicon oxide dielectric material to provide electrical contact to said metal lines further comprises forming said vias down to a top surface of said protective caps.

18. The process of claim 16 wherein said protective caps comprise a dielectric material selected from the group consisting of silicon oxide and silicon carbide, and said step of forming vias through said layer of standard k silicon oxide dielectric material to provide electrical contact to said metal lines further comprises also forming said vias down through said protective caps to said metal lines.

* * * * *